(12) United States Patent
Wang

(10) Patent No.: US 12,144,134 B2
(45) Date of Patent: Nov. 12, 2024

(54) PULLING MEMBER

(71) Applicant: Ting-Jui Wang, New Taipei (TW)

(72) Inventor: Ting-Jui Wang, New Taipei (TW)

(*) Notice: Subject to any disclaimer, the term of this patent is extended or adjusted under 35 U.S.C. 154(b) by 141 days.

(21) Appl. No.: 17/979,786

(22) Filed: Nov. 3, 2022

(65) Prior Publication Data

US 2024/0155792 A1    May 9, 2024

(51) Int. Cl.
*H05K 5/02*        (2006.01)

(52) U.S. Cl.
CPC ........... *H05K 5/023* (2013.01); *H05K 5/0221* (2013.01); *H05K 5/0256* (2013.01)

(58) Field of Classification Search
CPC .... H05K 5/023; H05K 5/0221; H05K 5/0256; H05K 7/1402
See application file for complete search history.

(56) References Cited

U.S. PATENT DOCUMENTS

| | | | |
|---|---|---|---|
| 2017/0188478 A1* | 6/2017 | Wang | G11B 33/124 |
| 2018/0220544 A1* | 8/2018 | Wang | H05K 7/1402 |
| 2019/0199024 A1* | 6/2019 | Wang | H01R 12/7058 |
| 2020/0337171 A1* | 10/2020 | Wang | G06F 1/187 |

FOREIGN PATENT DOCUMENTS

| | | | | |
|---|---|---|---|---|
| CN | 113099665 A | * | 7/2021 | ............ H05K 5/023 |
| TW | 201505525 A | * | 2/2015 | ............ G06F 1/187 |
| TW | 201940033 A | | 10/2019 | |
| TW | 201940041 A | * | 10/2019 | |
| TW | 201944398 A | * | 11/2019 | ............ H05K 7/02 |

* cited by examiner

*Primary Examiner* — Eret C McNichols
*Assistant Examiner* — Ding Y Tan

(57) ABSTRACT

A pulling member is introduced, which has flexibility or elasticity, the pulling member includes a corresponding part and a curved part, the curved part is disposed toward the corresponding part, the curved part is used to flexibly or elastically compress or abut against a plate body, in order to have a frictional force with the plate body when the pulling member is moving or staying. Accordingly, the pulling member of the present disclosure has the effects of simplicity of operation, saving labor and convenience.

38 Claims, 12 Drawing Sheets

PULLING MEMBER

BACKGROUND OF THE INVENTION

1. Field of the Invention

The present disclosure provides a pulling member, and in particular to a pulling member that is easy-handling, labor-saving and convenient.

2. Description of the Related Art

The traditional rack is usually equipped with an offload mechanism (also known as a card ejection mechanism), the function of the offload mechanism is to separate the hard disk or circuit board from a port configured in the rack, the user rotates the offload mechanism, and the hard disk or circuit board will be pushed up and displaced, and then detached from the port. However, the offload mechanism of the traditional rack can only displace the hard disk or circuit board by a short distance, because of the rack partition or adjacent side-by-side devices, it results in difficult and inconvenient access for users.

BRIEF SUMMARY OF THE INVENTION

In view of the above-mentioned prior art, the inventor developed a pulling member, with a view to achieving the purposes of simplicity of operation, saving labor and convenience.

To achieve the above objective and other objectives, the present disclosure provides a pulling member having flexibility or elasticity, the pulling member comprising: a corresponding part and a curved part. The curved part is disposed toward the corresponding part, the curved part is used to flexibly or elastically compress or abut against a plate body, in order to have a frictional force with the plate body when the pulling member is moving or staying.

The present disclosure further provides a pulling member having flexibility or elasticity, the pulling member comprising: a corresponding part and a curved part, the curved part is disposed toward the corresponding part, the curved part is used to flexibly or elastically compress or abut against a plate body, in order to have a frictional force with the plate body when the pulling member is moving or staying, and thus the pulling member may stay or temporarily stay in a position before or after the actuation.

The present disclosure further provides a pulling member having flexibility or elasticity, the pulling member comprising: a corresponding part and two limiting parts, the limiting parts are for limiting a plate body, and the plate body has a quick-detach guide rail, the quick-detach guide rail has at least one quick-detach hole part and a guide rail part; wherein each the limiting part has a flange part and a column part, the quick-detach hole part is larger than the flange parts, the column parts are smaller than the guide rail part, so that one of the flange parts first enters the quick-detach hole part, and then the column part of the one of the flange parts enters the guide rail part, and the other flange part bends by the flexibility or elastic characteristics of the pulling member to elastically enter the quick-detach hole part when the other flange part reaches the quick-detach hole part, and then the column part of the other flange part enters the guide rail part.

The present disclosure further provides a pulling member having flexibility or elasticity, the pulling member comprising: a corresponding part, a curved part and a limiting part. The curved part is disposed toward the corresponding part; the limiting part is removably assembled to a plate body; the limiting part is used to hold on the plate body, and the curved part is used to flexibly or elastically compress or abut against the plate body, in order to have a frictional force with the plate body when the pulling member is moving or staying, and thus the pulling member may stay or temporarily stay in a position before or after the actuation.

The present disclosure further provides a pulling member having flexibility or elasticity, the pulling member comprising: a corresponding part and a limiting part. The limiting part is used to limit a plate body, the plate body has a quick-detach guide rail, the quick-detach guide rail has at least one quick-detach hole part and a guide rail part; wherein the limiting part has a flange part and a column part, a part of the quick-detach hole part is larger than the flange part, a part of the quick-detach hole part is smaller than the flange part, the column part is smaller than the guide rail part, the pulling member is bent by the flexibility or elastic characteristics, so that the flange part enters part of the quick-detach hole part larger than the flange part at an angle, and then the column part enters the guide rail part.

The present disclosure further provides a pulling member having flexibility or elasticity, the pulling member comprising: a corresponding part and a limiting part, the limiting part is for limiting a plate body, and the plate body has a quick-detach guide rail, the quick-detach guide rail has a quick-detach hole part and a guide rail part; wherein the limiting part has a flange part and a column part, the quick-detach hole part is larger than the flange part, the column part is smaller than the guide rail part, so that the flange part first enters the quick-detach hole part, and then the column part of the flange part enters the guide rail part, a surface of the pulling member has a blocking part to block with a plate body, and the pulling member bends by the flexibility or elastic characteristics, in order to have a frictional force with the plate body when the pulling member is moving or staying, and thus the pulling member may stay or temporarily stay in a position before or after the actuation.

The present disclosure further provides a pulling member having flexibility or elasticity, the pulling member comprising: a corresponding part, a blocking part and a limiting part. The blocking part is disposed toward the corresponding part; the limiting part is removably assembled to a plate body; the limiting part is used to hold on the plate body, and the curved part is used to flexibly or elastically compress or abut against the plate body, in order to have a frictional force with the plate body when the pulling member is moving or staying, and thus the pulling member may stay or temporarily stay in a position before or after the actuation.

The present disclosure further provides a pulling member having flexibility or elasticity, the pulling member comprising: a corresponding part and a limiting part. The limiting part is used to limit a plate body, the plate body has a quick-detach guide rail, the quick-detach guide rail has at least one quick-detach hole part and a guide rail part; wherein the limiting part has a flange part and a column part, a part of the quick-detach hole part is larger than the flange part, a part of the quick-detach hole part is smaller than the flange part, the column part is smaller than the guide rail part, the pulling member is bent by the flexibility or elastic characteristics, so that the flange part enters part of the quick-detach hole part larger than the flange part at an angle, and then the column part enters the guide rail part.

The present disclosure further provides a pulling member having flexibility or elasticity, the pulling member comprising: a corresponding part and two limiting parts, the limiting parts are for limiting a plate body, and the plate body has a quick-detach guide rail, the quick-detach guide rail has at least one quick-detach hole part and a guide rail part; wherein each the limiting part has a flange part and a column part, the quick-detach hole part is larger than the flange parts, the column parts are smaller than the guide rail part, so that one of the flange parts first enters the quick-detach hole part, and then the column part of the one of the flange parts enters the guide rail part, and the other flange part bends by the flexibility or elastic characteristics of the pulling member to elastically enter the quick-detach hole part when the other flange part reaches the quick-detach hole part, and then the column part of the other flange part enters the guide rail part.

The present disclosure further provides a pulling member having flexibility or elasticity, the pulling member comprising: two flange parts and two quick-detach hole parts; wherein a part of the two quick-detach hole parts is larger than the two flange parts, a part of the two quick-detach hole parts is smaller than the two flange parts, the column part is smaller than the guide rail part, the pulling member is bent by the flexibility or elastic characteristics, so that the flange part enters part of the quick-detach hole part larger than the flange part at an angle, and then the column part enters the guide rail part.

The present disclosure further provides a pulling member having flexibility or elasticity, the pulling member comprising: a corresponding part and a limiting part, the limiting part is used to limit a plate body, the plate body has a quick-detach guide rail, the quick-detach guide rail has at least one quick-detach hole part and a guide rail part; wherein the limiting part has a flange part and a column part, the quick-detach hole part is larger than the flange part, the column part is smaller than the guide rail part, the pulling member is bent by the flexibility or elastic characteristics, so that the flange part enters the quick-detach hole part, and then the column part enters the guide rail part.

The present disclosure further provides a pulling member having flexibility or elasticity, the pulling member comprises a corresponding part and an abutting part, the pulling member has flexibility or elasticity, when a corresponding object is pulled out from the pulling member, the corresponding object abuts against the abutting part to make the pulling member flexibly or elastically bend to one side.

The present disclosure further provides a pulling member having flexibility or elasticity, the pulling member comprises a corresponding part and an abutting part, the pulling member has flexibility or elasticity, when a corresponding object is pulled out from the pulling member, the corresponding object abuts against the abutting part to make the pulling member flexibly or elastically bend to one side, thereby avoiding hitting a handle part.

The present disclosure further provides a pulling member having flexibility or elasticity, the pulling member comprising: a corresponding part and an abutting part, the pulling member has flexibility or elasticity, the abutting part abuts against a plate body, after the abutting part of the pulling member is disengaged from the abutting of the plate body, the pulling member flexibly or elastically moves to one side.

The present disclosure further provides a pulling member having flexibility or elasticity, the pulling member comprising: a corresponding part and an abutting part, the pulling member has flexibility or elasticity, the abutting part abuts against a plate body, after the abutting part of the pulling member is disengaged from the abutting of the plate body, the pulling member flexibly or elastically moves to one side, so that a corresponding object originally blocked by the pulling member may be taken out without blocking.

The present disclosure further provides a pulling member having flexibility or elasticity, the pulling member comprising: a corresponding part for moving a corresponding object.

In the pulling member, the pulling member has a handle part, the handle part is removably combined with a body part of the pulling member.

In the pulling member, the pulling member has a handle part, the handle part is combined removably with a body part of the pulling member, the handle part has a restriction part, the restriction part is for limiting or abutting against the plate body.

In the pulling member, the pulling member has a handle part, the handle part is combined removably with a body part of the pulling member, the handle part has a latch part, the latch part is for limiting the plate body.

In the pulling member, the quick-detach guide rail has one or two guide rail part(s).

In the pulling member, the flange part may cross the quick-detach hole part and move in the guide rail parts.

In the pulling member, the corresponding part is a pulling structure, L-type pulling part, fastening part, hook part or screw locking part.

In the pulling member, the pulling member pulls or clasps a memory, a circuit board, a metal piece, a housing, a plate body, a plastic body or a hard disk. In the pulling member, the pulling member has the curved part, the plate body has an elasticity-limiting part, the curved part is flexibly or elastically limited at the elasticity-limiting part.

In the pulling member, the pulling member has a body part, the body part is removably provided on the plate body, a section of the body part leaving the plate body bends to one side to avoid interference at pulling the plate body.

In the pulling member, the pulling member is a metallic or non-metallic material having flexibility or elasticity.

In the pulling member, the pulling member is a metallic material having flexibility or elasticity which is suitable for stamping the metal into a structure of the pulling member and then heated to produce the flexibility or elasticity.

In the pulling member, the pulling member is suitable for removably loading on a computer, server, storage, hard disk or heat sink.

In the pulling member, distances of the flange parts and the quick-detach hole parts are that one is long and the other is short, or one is short and the other is long, or they are the same length, so that one of the flange parts first enters one of the quick-detach hole parts, and then the other flange flexibly or elastically enters the other quick-detach hole part.

In the pulling member, the flange part has a flexible distance, elastic motion distance or pre-abutting distance abutting against the plate body for allowing the flange part to elastically enter the quick-detach hole part.

In the pulling member, the flange part has a flexible distance, elastic motion distance or pre-abutting distance abutting against the plate body for allowing the flange part to automatically elastically enter the quick-detach hole part when the flange part reaches the quick-detach hole.

In the pulling member, the pulling member has a blocking part, or the plate body has an abutting part, wherein the blocking part or the abutting part is a convex part, a concave part, a curved part, a cambered face part, a curved face part, a step part or a plane part.

In the pulling member, the handle part has a switching part, the switching part abuts against an elastomer, the elastomer gives the switching part a reciprocating elastic force at switching.

In the pulling member, the restriction part is a drawing structure for a lever center part of the handle part removably assembled with the pulling member to carry out a lever switch force movement with the plate body.

In the pulling member, when the lever force movement is carried out, the handle part is driven to carry out a lifting movement toward a direction of the lever force.

In the pulling member, the abutting part is a bevel, curved face, cambered face or convex part, and the abutting part may be integrally formed with the pulling member, or combined with the pulling member in expanded connection, riveted connection, fastened connection or welded connection.

In the pulling member, when the pulling member is pulled in a vertical direction, the pulling member is limited to a distance that can be pulled by a limiting structure between the limiting part and the plate body.

In the pulling member, when the corresponding object is put into or taken out from a pulling space of the pulling member, the corresponding object abuts against the abutting part to make the pulling member bend to one side.

In the pulling member, the pulling member is put into or taken out from a pulling space of the plate body, the plate body abuts against the abutting part to make the pulling member bend to one side.

In the pulling member, the abutting part is a structure that can cause the corresponding object to apply force to abut and slide or to abut and be slid.

In the pulling member, the pulling part has a flange part, the flange part has a flexible distance, elastic motion distance or pre-abutting distance abutting against the plate body for allowing the flange part to elastically enter the quick-detach hole part.

In the pulling member, the pulling part has a flange part, the flange part has a flexible distance, elastic motion distance or pre-abutting distance abutting against the plate body for allowing the flange part to automatically elastically enter the quick-detach hole part.

Accordingly, the pulling member of the present disclosure has the effects of simplicity of operation, saving labor and convenience.

DETAILED DESCRIPTION OF THE INVENTION

To facilitate understanding of the above purpose, characteristics and effects of this present disclosure, embodiments together with the attached drawings for the detailed description of the present disclosure are provided as below.

Figure 1:
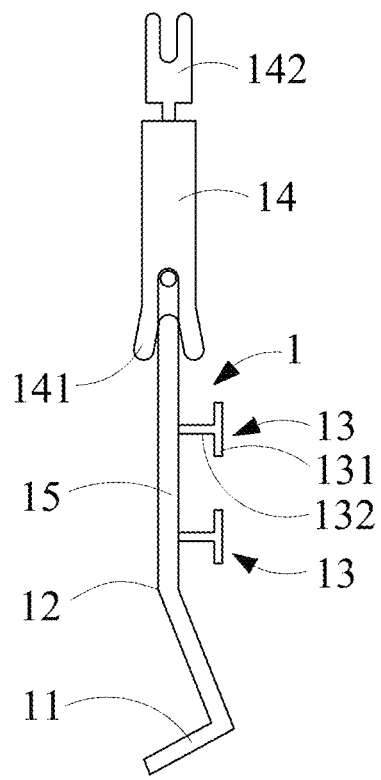
FIG. 1 is a schematic outside view of a pulling member of a first embodiment of the present disclosure.
Figure 2:
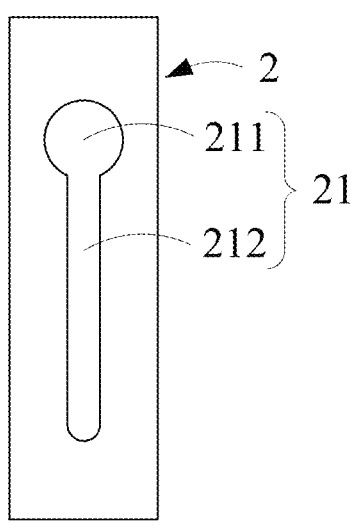
FIG. 2 is a schematic outside view of a plate body of the first embodiment of the present disclosure.
Figure 3:
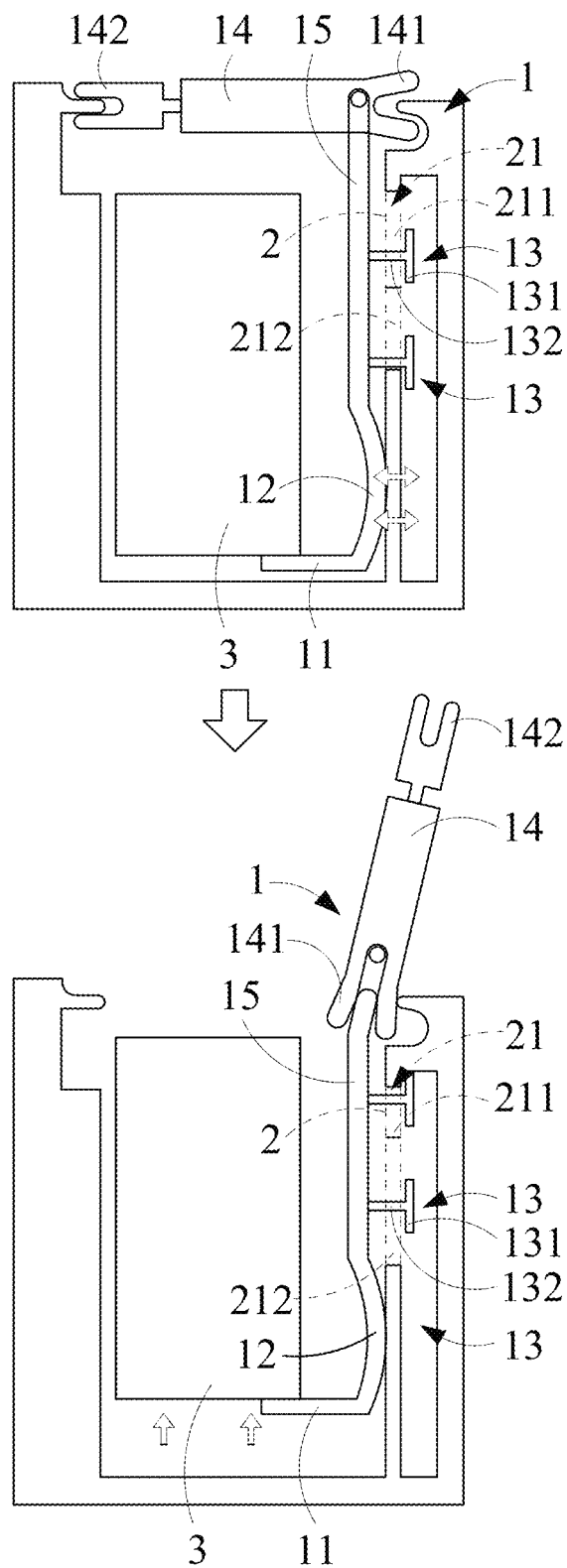
FIG. 3 is a schematic view of a using state of the pulling member of the first embodiment of the present disclosure.

Referring to FIG. 1 to FIG. 3, it is a pulling member 1 of the present disclosure, which has flexibility or elasticity, the pulling member 1 comprising: a corresponding part 11 for moving a corresponding object 3, or for switching a corresponding object 3.

In one embodiment of the present disclosure, the pulling member 1 may comprise: a corresponding part 11 and a curved part 12, the curved part 12 is disposed toward the corresponding part 11, and the curved part 12 is adjacent to the corresponding part 11, the curved part 12 is used to flexibly or elastically compress or abut against a plate body 2, in order to have a frictional force with the plate body 2 when the pulling member 1 is moving or staying, and thus the pulling member 1 may stay or temporarily stay in a position before or after the actuation; accordingly, the pulling member 1 has the purposes of simplicity of operation, saving labor and convenience.

In one embodiment of the present disclosure, the pulling member 1 may comprise two limiting parts 13, the curved part 12 is located between the corresponding part 11 and the two limiting parts 13, the limiting parts 13 are for limiting the plate body 2, and the plate body 2 has a quick-detach guide rail 21, the quick-detach guide rail 21 has at least one quick-detach hole part 211 and a guide rail part 212; wherein each the limiting part 13 has a flange part 131 and a column part 132, the quick-detach hole part 211 is larger than the flange parts 131, the column parts 132 are smaller than the guide rail part 212, so that one of the flange parts 131 first enters the quick-detach hole part 211, and then the column part 132 of the one of the flange parts 131 enters the guide rail part 212, and the other flange part 131 bends by the flexibility or elastic characteristics of the pulling member 1 to elastically enter the quick-detach hole part 211 when the other flange part 131 reaches the quick-detach hole part 211, and then the column part 132 of the other flange part 131 enters the guide rail part 212; accordingly, the pulling member 1 has the purposes of simplicity of operation, saving labor and convenience.

In one embodiment of the present disclosure, the pulling member 1 has a handle part 14, the handle part 14 is combined removably with a body part 15 of the pulling member 1. Accordingly, the handle part 14 may be operated by force, so that the pulling member 1 is driven by the handle part 14, and bent with the flexibility or elastic characteristics of the pulling member 1, so that each the limiting part 13 goes with the quick-detach guide rail 21 to be fastened or separated, and then the pulling member 1 has a frictional force with the plate body 2 when the pulling member 1 is moving or staying, and thus the pulling member 1 may stay or temporarily stay in a position before or after the actuation; accordingly, the pulling member 1 has the purposes of simplicity of operation, saving labor and convenience.

In one embodiment of the present disclosure, the handle part 14 has a restriction part 141 and a latch part 142, the restriction part 141 and the latch part 142 are for limiting or abutting against the plate body 2. Accordingly, after each the limiting part 13 goes with the quick-detach guide rail 21 to be fastened, the restriction part 141 and the latch part 142 are used to fasten and limit the plate body 2.

In one embodiment of the present disclosure, the pulling member 1 pulls or clasps a corresponding object 3, and the corresponding object 3 may be a memory, a circuit board, a metal piece, a housing, a plate body, a plastic body or a hard disk. In the present embodiment, the pulling member 1 may pull or clasp the corresponding object 3 by the corresponding part 11. In addition, the pulling member 1 is suitable for removably loading on a computer, server, storage, hard disk or heat sink.

In one embodiment of the present disclosure, the pulling member 1 is a metallic or non-metallic material having flexibility or elasticity, so that the pulling member 1 meets the needs of practical application.

In one embodiment of the present disclosure, the pulling member 1 is a metallic material having flexibility or elasticity which is suitable for stamping the metal into a structure of the pulling member and then heated to produce the flexibility or elasticity, so that the pulling member 1 meets the needs of practical application.

In one embodiment of the present disclosure, distances of the flange parts 131 and the quick-detach hole parts 211 are that one is long and the other is short, or one is short and the other is long, or they are the same length, so that one of the flange parts 131 first enters one of the quick-detach hole parts 211, and then the other flange 131 flexibly or elastically enters the other quick-detach hole part 211.

In one embodiment of the present disclosure, the flange part 131 has a flexible distance, elastic motion distance or pre-abutting distance abutting against the plate body 2 for allowing the flange part 131 to elastically enter the quick-detach hole part 211.

In one embodiment of the present disclosure, the corresponding part 11 is a pulling structure, L-type pulling part, fastening part, hook part or screw locking part. Accordingly, the pulling member 1 may pull or clasp the corresponding object 3 by the corresponding part 11, and allow the corresponding object 3 to achieve the effect of firmly setting.

Figure 4:
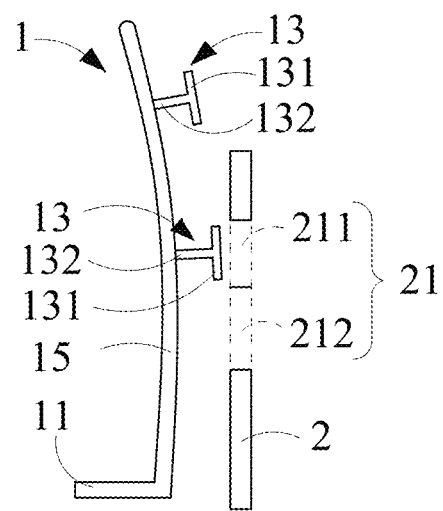
FIG. 4 is a schematic view 1 of a using state of the pulling member of a second embodiment of the present disclosure.
Figure 4:
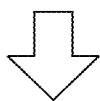
Figure 4:
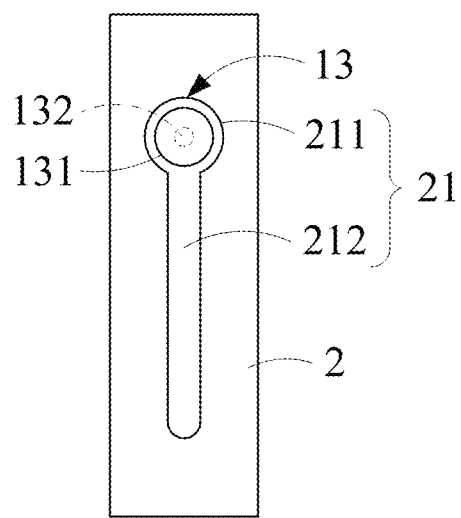
Figure 5:
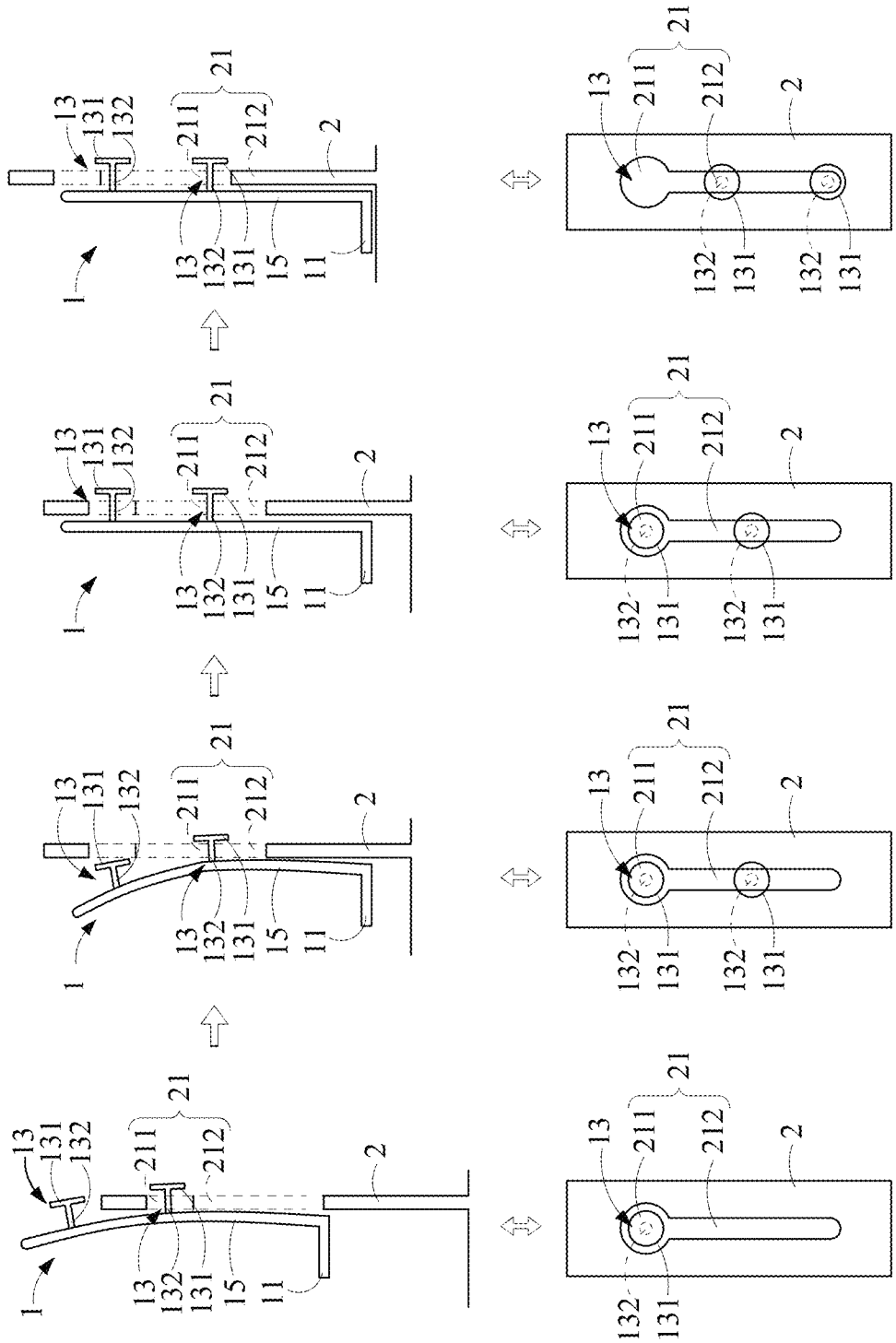
FIG. 5 is a schematic view 2 of a using state of the pulling member of the second embodiment of the present disclosure.

Referring to FIGS. 4 and 5, in one embodiment of the present disclosure, the quick-detach guide rail 21 has one guide rail part 212, the pulling member 1 is bent by the flexibility or elastic characteristics, so that the flange part 131 enters part of the quick-detach hole part 211 larger than the flange part 131 at an angle, and then the column part 132 enters the guide rail part 212, and thus the pulling member 1 may stay or temporarily stay in a position before or after the actuation, and the body part 15 is removably provided on the plate body 2, and a section of the body part 15 leaving the plate body 2 bends to one side to avoid interference at pulling the plate body; accordingly, the pulling member 1 has the purposes of simplicity of operation, saving labor and convenience.

In one embodiment of the present disclosure, the flange part 131 has a flexible distance, elastic motion distance or pre-abutting distance abutting against the plate body 2 for allowing the flange part 131 to automatically elastically enter the quick-detach hole part 211 when the flange part 131 reaches the quick-detach hole.

Figure 6:
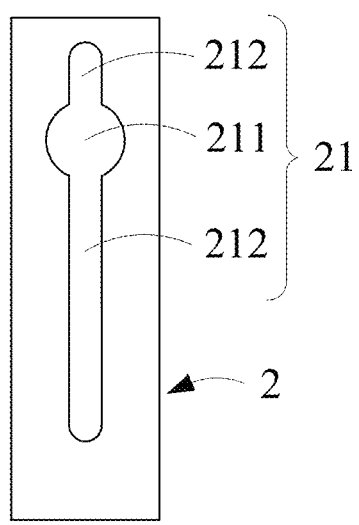
FIG. 6 is a schematic outside view of a plate body of the second embodiment of the present disclosure.
Figure 7:
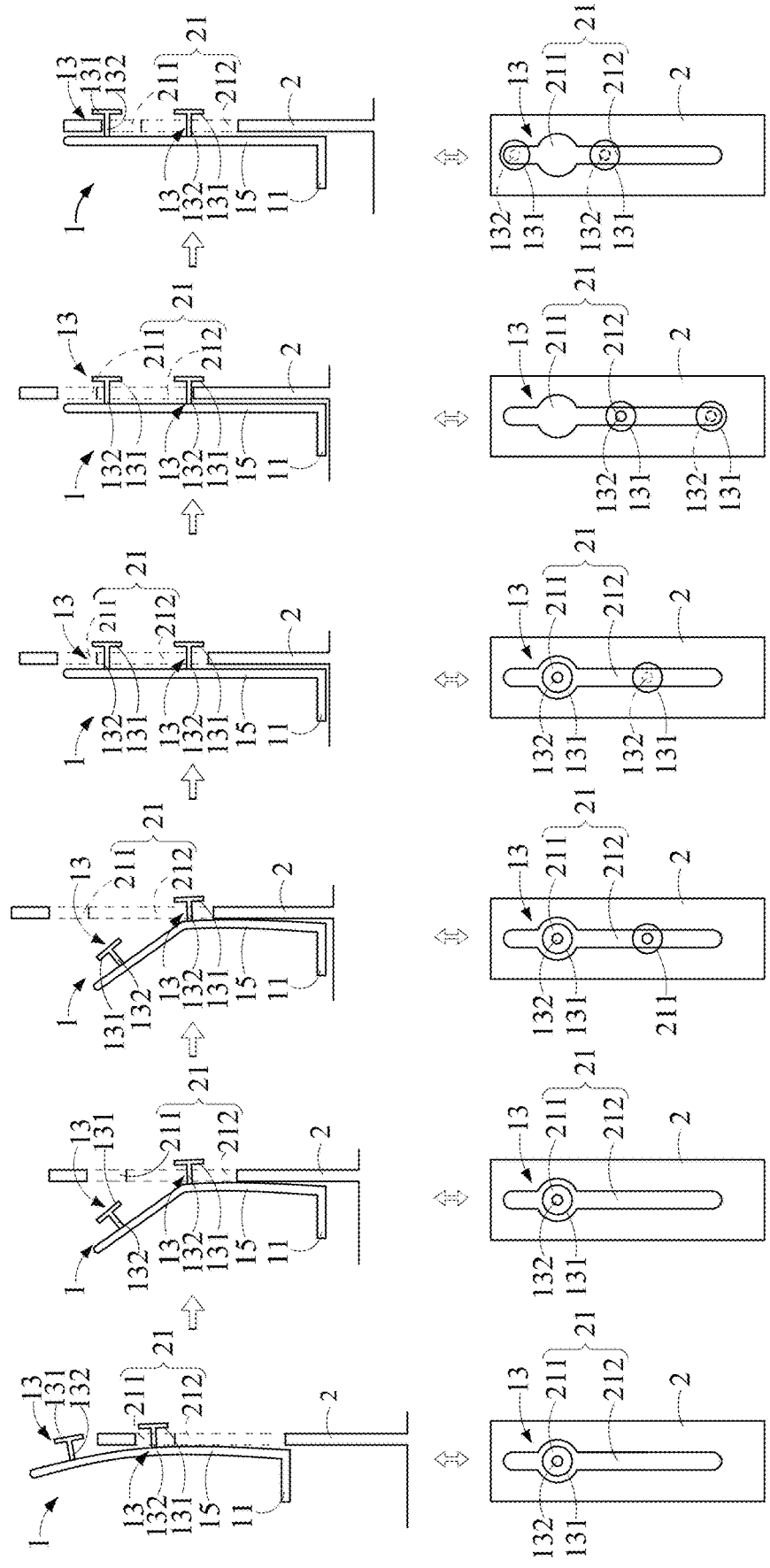
FIG. 7 is a schematic view of a using state of the pulling member of a third embodiment of the present disclosure.

Referring to FIGS. 6 and 7, in one embodiment of the present disclosure, the quick-detach guide rail 21 has two guide rail parts 212 (as shown in FIG. 6); accordingly, the limiting part 13 may be cooperated to achieve different types of guide rail part 212 to meet the needs of fastening.

In one embodiment of the present disclosure, it differs from the above embodiments in that the quick-detach guide rail 21 has two guide rail parts 212, so that the flange part 131 may cross the quick-detach hole part 211 and move in the guide rail parts 212. Accordingly, the limiting part 13 may be cooperated to achieve different types of guide rail part 212 to meet the needs of fastening.

Figure 8:
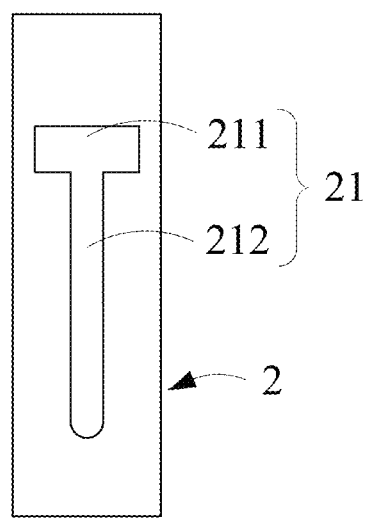
FIG. 8 is a schematic outside view of a plate body of the third embodiment of the present disclosure.
Figure 9:
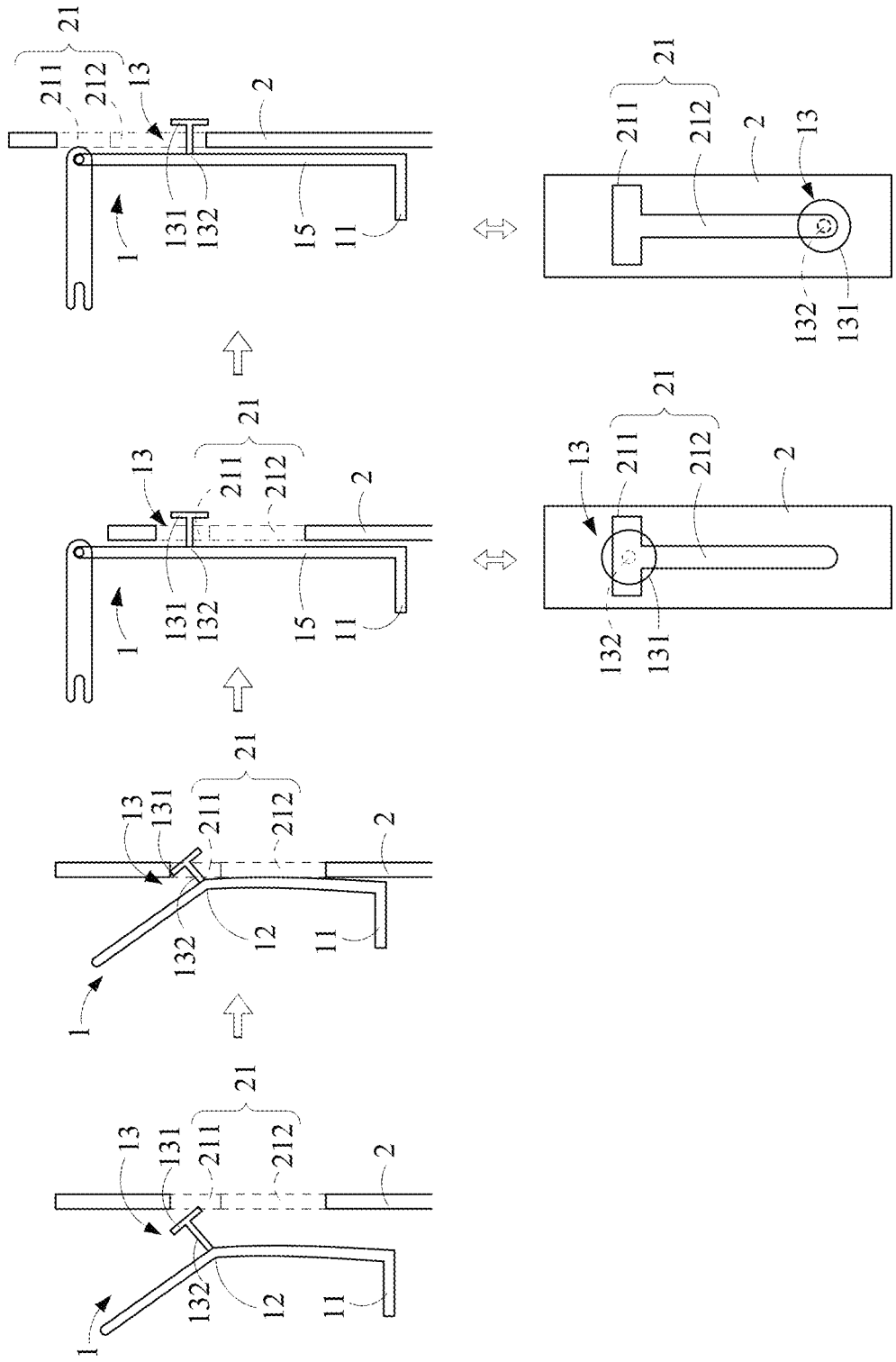
FIG. 9 is a schematic view of a using state of the pulling member of a fourth embodiment of the present disclosure.

Referring to FIGS. 8 and 9, in one embodiment of the present disclosure, it differs from the above embodiments in that the pulling member 1 has a limiting part 13, the limiting part 13 is removably assembled to the plate body 2, and the limiting part 13 is used to hold on the plate body 2, and the curved part 12 is used to flexibly or elastically compress or abut against the plate body 2, in order to have a frictional force with the plate body 2 when the pulling member 1 is moving or staying, and thus the pulling member 1 may stay or temporarily stay in a position before or after the actuation.

In one embodiment of the present disclosure, a part of the quick-detach hole part 211 of the quick-detach guide rail 21 is larger than the flange part 131, a part of the quick-detach hole part 211 is smaller than the flange part 131, the column part 132 is smaller than the guide rail part 212 (i.e., the quick-detach hole part 211 and the guide rail part 212 form a T-shape), the pulling member 1 is bent by the flexibility or elastic characteristics, so that the flange part 131 enters part of the quick-detach hole part 211 larger than the flange part 131 at an angle, and then the column part 132 enters the guide rail part 212, and thus the pulling member 1 may stay or temporarily stay in a position before or after the actuation, and the body part 15 is removably provided on the plate body 2, and a section of the body part 15 leaving the plate body 2 bends to one side to avoid interference at pulling the plate body; accordingly, the pulling member 1 has the purposes of simplicity of operation, saving labor and convenience.

Figure 10:
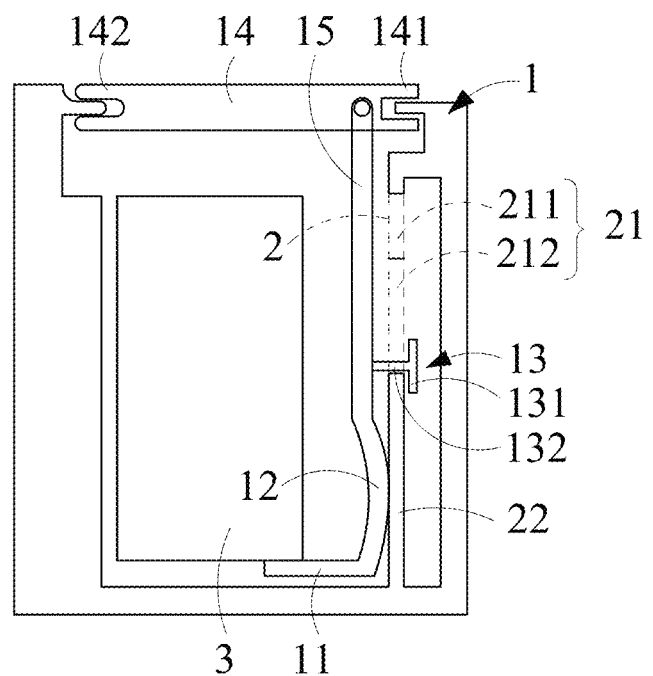
FIG. 10 is a schematic view of a using state of the pulling member of a fifth embodiment of the present disclosure.

Referring to FIG. 10, in one embodiment of the present disclosure, the curved part 12 is adjacent to the corresponding part 11, the plate body 2 has an elasticity-limiting part 22, the curved part 12 is flexibly or elastically limited at the elasticity-limiting part 22. Accordingly, after the pulling member 1 is fastened by the limiting part 13 going with the quick-detach guide rail 21, the restriction part 141 is fastened with the latch part 142 to limit the plate body 2, and at the same time the curved part 12 is limited at the elasticity-limiting part 22, and the corresponding object 3 is allowed to achieve the effect of firmly setting.

Figure 11:
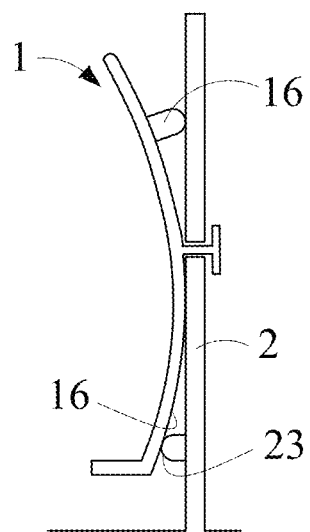
FIG. 11 is a schematic view of the pulling member of a sixth embodiment of the present disclosure.

Referring to FIG. 11, in one embodiment of the present disclosure, the pulling member 1 has a blocking part 16, the plate body 2 has an abutting part 23, wherein the blocking part 16 or the abutting part 23 may be a convex part, a concave part, a curved part, a cambered face part, a curved face part, a step part or a plane part.

Figure 12:
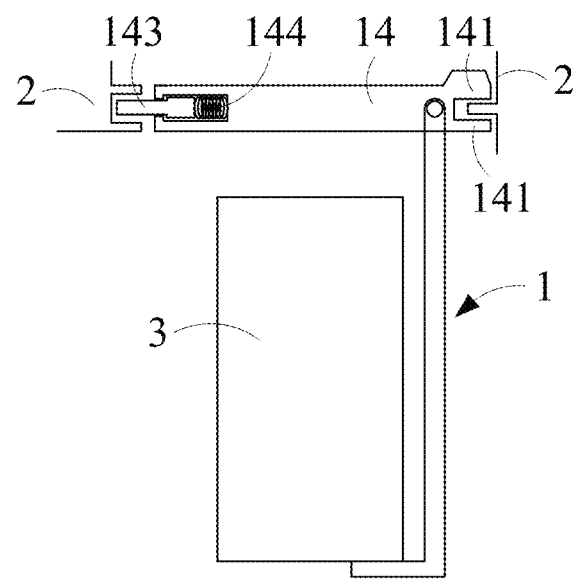
FIG. 12 is a schematic view of the pulling member of a seventh embodiment of the present disclosure.

Referring to FIG. 12, in one embodiment of the present disclosure, the handle part 14 has a switching part 143, the switching part 143 abuts against an elastomer 144, the elastomer 144 gives the switching part 143 a reciprocating elastic force at switching, wherein the restriction part 141 may be a drawing structure for a lever center part of the handle part 14 removably assembled with the pulling member 1 to carry out a lever switch force movement with the plate body 2, and when the lever force movement is carried out, the handle part 14 is driven to carry out a lifting movement toward a direction of the lever force.

Figure 13:
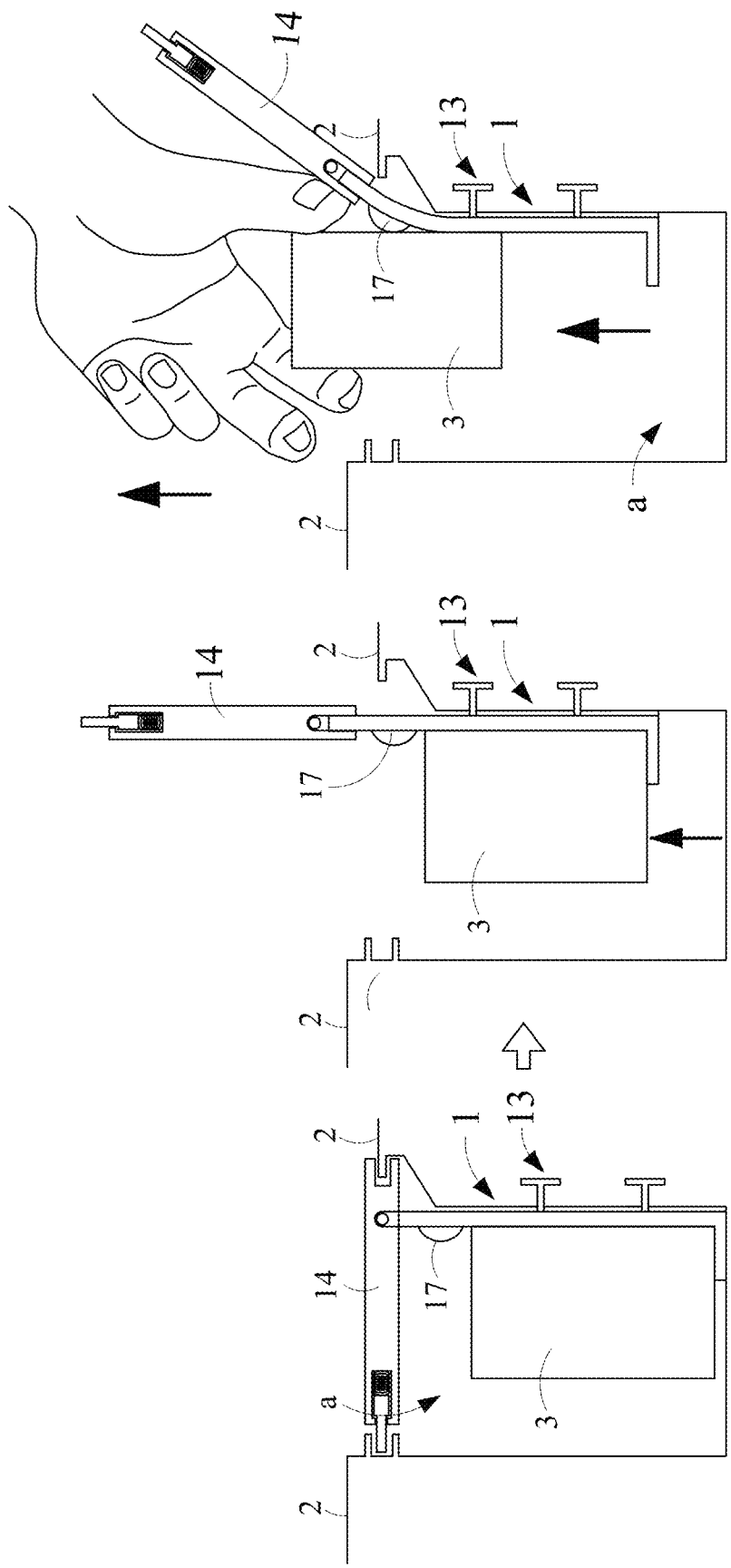
FIG. 13 is a schematic view of the pulling member of an eighth embodiment of the present disclosure.

Referring to FIG. 13, in one embodiment of the present disclosure, the pulling member 1 comprises a corresponding part 11 and an abutting part 17, and the pulling member 1 has flexibility or elasticity, when a corresponding object 3 is pulled out from the pulling member 1, the corresponding object 3 abuts against the abutting part 17 to make the pulling member 1 flexibly or elastically bend to one side, thereby avoiding hitting the handle part 14.

In one embodiment of the present disclosure, the abutting part 17 is a bevel, curved face, cambered face or convex part, and the abutting part 17 may be integrally formed with the pulling member 1, or combined with the pulling member 1 in expanded connection, riveted connection, fastened connection or welded connection.

In one embodiment of the present disclosure, when the pulling member 1 is pulled in a vertical direction, the pulling member 1 is limited to a distance that can be pulled by a limiting structure between the limiting part 13 and the plate body 2.

In one embodiment of the present disclosure, when the corresponding object 3 is put into or taken out from a pulling space a of the pulling member 1, the corresponding object 3 abuts against the abutting part 17 to make the pulling member 1 bend to one side.

In one embodiment of the present disclosure, the abutting part 17 is a structure that can cause the corresponding object 3 to apply force to abut and slide or to abut and be slid.

Figure 14:
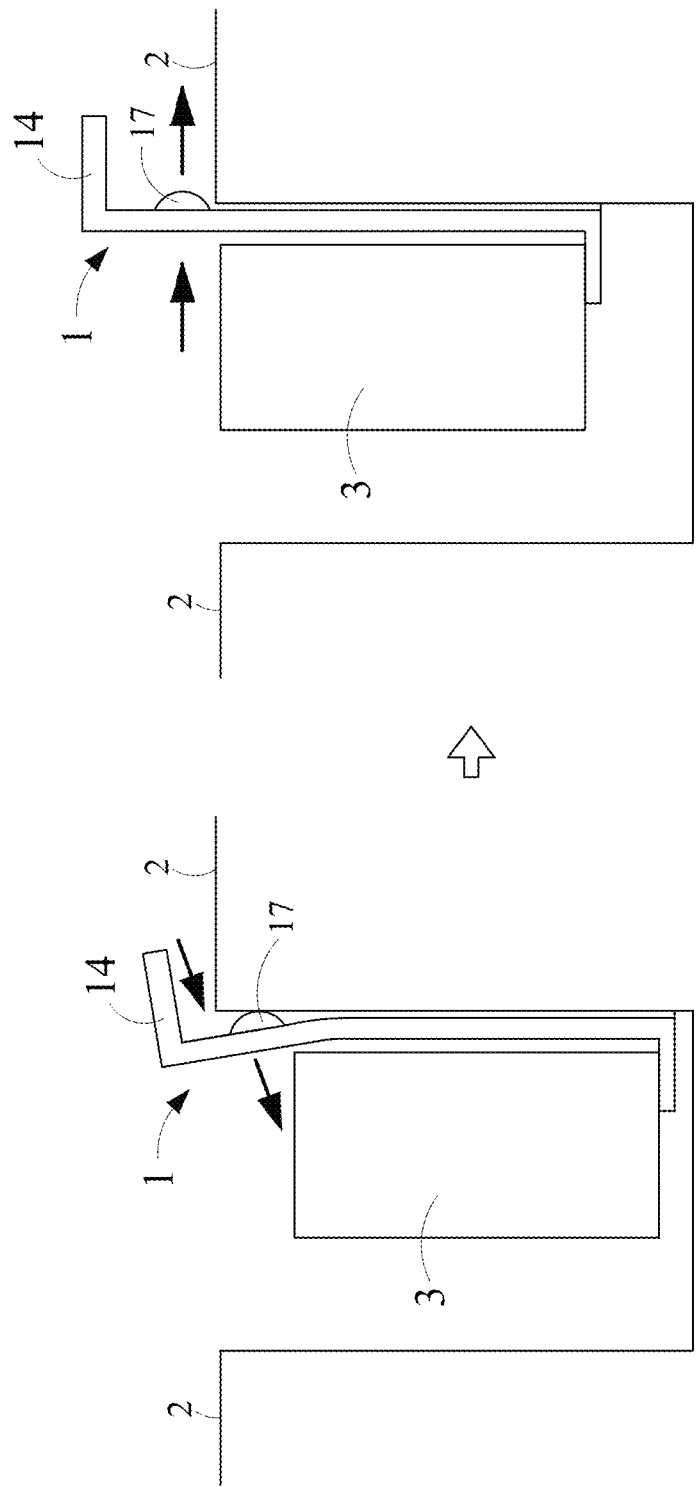
FIG. 14 is a schematic view of the pulling member of a ninth embodiment of the present disclosure.

Referring to FIG. 14, in one embodiment of the present disclosure, the pulling member 1 comprises a corresponding part 11 and an abutting part 17, and the pulling member 1 has a flexibility or elasticity, the abutting part 17 abuts against a plate body 2, after the abutting part 17 of the pulling member 1 is disengaged from the abutting of the plate body 2, the pulling member 1 flexibly or elastically moves to one side, so that a corresponding object 3 originally blocked by the pulling member 1 may be taken out without blocking.

In one embodiment of the present disclosure, the pulling member 1 is put into or taken out from a pulling space a of the plate body 2, the plate body 2 abuts against the abutting part 17 to make the pulling member 1 bend to one side.

While the present disclosure has been described by means of preferable embodiments, those skilled in the art should understand the above description is merely embodiments of the disclosure, and it should not be considered to limit the scope of the disclosure. It should be noted that all changes and substitutions which come within the meaning and range of equivalency of the embodiments are intended to be embraced in the scope of the disclosure. Therefore, the scope of the disclosure is defined by the claims.

What is claimed is:

1. A pulling member, having flexibility or elasticity, the pulling member comprising:
    a corresponding part;
    two limiting parts, the limiting parts are for limiting a plate body, and the plate body has a quick-detach guide rail, the quick-detach guide rail has at least one quick-detach hole part and at least one guide rail part; and
    a curved part, disposed toward the corresponding part, the curved part is located between the corresponding part and the two limiting parts, and the curved part flexibly or elastically compresses or abuts against the plate body, in order to have a frictional force with the plate body when the pulling member is moving or staying, and thus the pulling member stays or temporarily stays in a position before or after the actuation;
    wherein each the limiting part has a flange part and a column part, the quick-detach hole part is larger than the flange parts, the column parts are smaller than the guide rail part, so that one of the flange parts first enters the quick-detach hole part, and then the column part of the one of the flange parts enters the guide rail part, and the other flange part bends by the flexibility or elastic characteristics of the pulling member to elastically enter the quick-detach hole part when the other flange part reaches the quick-detach hole part, and then the column part of the other flange part enters the guide rail part.

2. A pulling member, having flexibility or elasticity, the pulling member comprising:
    a corresponding part;
    a curved part, disposed toward the corresponding part; and
    a limiting part, removably assembled to a plate body, the curved part is located between the corresponding part and the limiting part;
    the limiting part is used to hold on the plate body, and the curved part flexibly or elastically compresses or abuts against the plate body, in order to have a frictional force with the plate body when the pulling member is moving or staying, and thus the pulling member stays or temporarily stays in a position before or after the actuation.

3. A pulling member, having flexibility or elasticity, the pulling member comprising:
    a corresponding part;
    a limiting part, the limiting part is for limiting a plate body, and the plate body has a quick-detach guide rail, the quick-detach guide rail has at least one quick-detach hole part and a guide rail part; and
    a curved part, disposed toward the corresponding part, the curved part is located between the corresponding part and the limiting part, and the curved part flexibly or elastically compresses or abuts against the plate body, in order to have a frictional force with the plate body when the pulling member is moving or staying, and thus the pulling member stays or temporarily stays in a position before or after the actuation;
    wherein the limiting part has a flange part and a column part, a part of the quick-detach hole part is larger than the flange part, a part of the quick-detach hole part is smaller than the flange part, the column part is smaller than the guide rail part, the pulling member is bent by the flexibility or elastic characteristics, so that the flange part enters part of the quick-detach hole part larger than the flange part at an angle, and then the column part enters the guide rail part.

4. A pulling member, having flexibility or elasticity, the pulling member comprising:
    a corresponding part;
    a limiting part, the limiting part is for limiting a plate body, and the plate body has a quick-detach guide rail, the quick-detach guide rail has a quick-detach hole part and a guide rail part; and
    a curved part, disposed toward the corresponding part, the curved part is located between the corresponding part and the limiting part, and the curved part flexibly or elastically compresses or abuts against the plate body, in order to have a frictional force with the plate body when the pulling member is moving or staying;
    wherein the limiting part has a flange part and a column part, the quick-detach hole part is larger than the flange part, the column part is smaller than the guide rail part, so that the flange part first enters the quick-detach hole part, and then the column part of the flange part enters the guide rail part, a surface of the pulling member has a blocking part to block with a plate body, and the pulling member bends by the flexibility or elastic characteristics, in order to have a frictional force with the plate body when the pulling member is moving or staying, and thus the pulling member stays or temporarily stays in a position before or after the actuation.

5. A pulling member, having flexibility or elasticity, the pulling member comprising:
   a corresponding part;
   a limiting part, the limiting part is for limiting a plate body, and the plate body has a quick-detach guide rail, the quick-detach guide rail has at least one quick-detach hole part and a guide rail part; and
   a curved part, disposed toward the corresponding part, the curved part is located between the corresponding part and the limiting part, and the curved part flexibly or elastically compresses or abuts against the plate body, in order to have a frictional force with the plate body when the pulling member is moving or staying, and thus the pulling member stays or temporarily stays in a position before or after the actuation;
   wherein the limiting part has a flange part and a column part, the quick-detach hole part is larger than the flange part, the column part is smaller than the guide rail part, the pulling member is bent by the flexibility or elastic characteristics, so that the flange part enters the quick-detach hole part, and then the column part enters the guide rail part.

6. A pulling member, having flexibility or elasticity, the pulling member comprising:
   a corresponding part;
   a limiting part, the limiting part is for limiting a plate body, and the plate body has a quick-detach guide rail, the quick-detach guide rail has at least one quick-detach hole part and a guide rail part;
   a curved part, disposed toward the corresponding part, the curved part flexibly or elastically compresses or abuts against the plate body, in order to have a frictional force with the plate body when the pulling member is moving or staying, the curved part is located between the corresponding part and the limiting part, and the curved part compresses or abuts against the plate body, and thus the pulling member stays or temporarily stays in a position before or after the actuation; and
   an abutting part, the pulling member has flexibility or elasticity, when a corresponding object is pulled out from the pulling member, the corresponding object abuts against the abutting part to make the pulling member flexibly or elastically bend to one side.

7. A pulling member, having flexibility or elasticity, the pulling member comprising:
   a corresponding part;
   a limiting part, the limiting part is for limiting a plate body, and the plate body has a quick-detach guide rail, the quick-detach guide rail has at least one quick-detach hole part and a guide rail part;
   a curved part, disposed toward the corresponding part, the curved part flexibly or elastically compresses or abuts against the plate body, in order to have a frictional force with the plate body when the pulling member is moving or staying, the curved part is located between the corresponding part and the limiting part, and the curved part compresses or abuts against the plate body, and thus the pulling member stays or temporarily stays in a position before or after the actuation; and
   an abutting part, the pulling member has flexibility or elasticity, the abutting part abuts against a plate body, after the abutting part of the pulling member is disengaged from the abutting of the plate body, the pulling member flexibly or elastically moves to one side, so that a corresponding object originally blocked by the pulling member is taken out without blocking.

8. The pulling member according to claim 1, wherein the pulling member has a handle part, the handle part is combined removably with a body part of the pulling member, the handle part has a restriction part, the restriction part is for limiting or abutting against the plate body, or the handle part has a latch part, the latch part is for limiting the plate body.

9. The pulling member according to claim 2, wherein the pulling member has a handle part, the handle part is combined removably with a body part of the pulling member, the handle part has a restriction part, the restriction part is for limiting or abutting against the plate body, or the handle part has a latch part, the latch part is for limiting the plate body.

10. The pulling member according to claim 3, wherein the pulling member has a handle part, the handle part is combined removably with a body part of the pulling member, the handle part has a restriction part, the restriction part is for limiting or abutting against the plate body, or the handle part has a latch part, the latch part is for limiting the plate body.

11. The pulling member according to claim 4, wherein the pulling member has a handle part, the handle part is combined removably with a body part of the pulling member, the handle part has a restriction part, the restriction part is for limiting or abutting against the plate body, or the handle part has a latch part, the latch part is for limiting the plate body.

12. The pulling member according to claim 5, wherein the pulling member has a handle part, the handle part is combined removably with a body part of the pulling member, the handle part has a restriction part, the restriction part is for limiting or abutting against the plate body, or the handle part has a latch part, the latch part is for limiting the plate body.

13. The pulling member according to claim 6, wherein the pulling member has a handle part, the handle part is combined removably with a body part of the pulling member, the handle part has a restriction part, the restriction part is for limiting or abutting against the plate body, or the handle part has a latch part, the latch part is for limiting the plate body.

14. The pulling member according to claim 7, wherein the pulling member has a handle part, the handle part is combined removably with a body part of the pulling member, the handle part has a restriction part, the restriction part is for limiting or abutting against the plate body, or the handle part has a latch part, the latch part is for limiting the plate body.

15. The pulling member according to claim 1, wherein the plate body has an elasticity-limiting part, the curved part is flexibly or elastically limited at the elasticity-limiting part, or the pulling member has a body part, the body part is removably provided on the plate body, a section of the body part leaving the plate body bends to one side to avoid interference at pulling the plate body.

16. The pulling member according to claim 2, wherein the plate body has an elasticity-limiting part, the curved part is flexibly or elastically limited at the elasticity-limiting part, or the pulling member has a body part, the body part is removably provided on the plate body, a section of the body part leaving the plate body bends to one side to avoid interference at pulling the plate body.

17. The pulling member according to claim 3, wherein the the plate body has an elasticity-limiting part, the curved part is flexibly or elastically limited at the elasticity-limiting part, or the pulling member has a body part, the body part is removably provided on the plate body, a section of the body part leaving the plate body bends to one side to avoid interference at pulling the plate body.

18. The pulling member according to claim 4, wherein the the plate body has an elasticity-limiting part, the curved part is flexibly or elastically limited at the elasticity-limiting part, or the pulling member has a body part, the body part is removably provided on the plate body, a section of the body part leaving the plate body bends to one side to avoid interference at pulling the plate body.

19. The pulling member according to claim 5, wherein the plate body has an elasticity-limiting part, the curved part is flexibly or elastically limited at the elasticity-limiting part, or the pulling member has a body part, the body part is removably provided on the plate body, a section of the body part leaving the plate body bends to one side to avoid interference at pulling the plate body.

20. The pulling member according to claim 6, wherein the plate body has an elasticity-limiting part, the curved part is flexibly or elastically limited at the elasticity-limiting part, or the pulling member has a body part, the body part is removably provided on the plate body, a section of the body part leaving the plate body bends to one side to avoid interference at pulling the plate body.

21. The pulling member according to claim 7, wherein the plate body has an elasticity-limiting part, the curved part is flexibly or elastically limited at the elasticity-limiting part, or the pulling member has a body part, the body part is removably provided on the plate body, a section of the body part leaving the plate body bends to one side to avoid interference at pulling the plate body.

22. The pulling member according to claim 1, wherein distances of the flange parts and the quick-detach hole parts are that one is long and the other is short, or one is short and the other is long, or they are the same length, so that one of the flange parts first enters one of the quick-detach hole parts, and then the other flange flexibly or elastically enters the other quick-detach hole part.

23. The pulling member according to claim 1, wherein the flange part has a flexible distance, elastic motion distance or pre-abutting distance abutting against the plate body for allowing the flange part to elastically enter the quick-detach hole part, or automatically elastically enter the quick-detach hole part when the flange part reaches the quick-detach hole.

24. The pulling member according to claim 3, wherein the flange part has a flexible distance, elastic motion distance or pre-abutting distance abutting against the plate body for allowing the flange part to elastically enter the quick-detach hole part, or automatically elastically enter the quick-detach hole part when the flange part reaches the quick-detach hole.

25. The pulling member according to claim 4, wherein the flange part has a flexible distance, elastic motion distance or pre-abutting distance abutting against the plate body for allowing the flange part to elastically enter the quick-detach hole part, or automatically elastically enter the quick-detach hole part when the flange part reaches the quick-detach hole.

26. The pulling member according to claim 5, wherein the flange part has a flexible distance, elastic motion distance or pre-abutting distance abutting against the plate body for allowing the flange part to elastically enter the quick-detach hole part, or automatically elastically enter the quick-detach hole part when the flange part reaches the quick-detach hole.

27. The pulling member according to claim 1, wherein the pulling member has a blocking part, or the plate body has an abutting part, wherein the blocking part or the abutting part is a convex part, a concave part, a curved part, a cambered face part, a curved face part, a step part or a plane part, or the pulling member has a handle part, the handle part has a switching part, the switching part abuts against an elastomer, the elastomer gives the switching part a reciprocating elastic force at switching.

28. The pulling member according to claim 2, wherein the pulling member has a blocking part, or the plate body has an abutting part, wherein the blocking part or the abutting part is a convex part, a concave part, a curved part, a cambered face part, a curved face part, a step part or a plane part, or the pulling member has a handle part, the handle part has a switching part, the switching part abuts against an elastomer, the elastomer gives the switching part a reciprocating elastic force at switching.

29. The pulling member according to claim 3, wherein the pulling member has a blocking part, or the plate body has an abutting part, wherein the blocking part or the abutting part is a convex part, a concave part, a curved part, a cambered face part, a curved face part, a step part or a plane part, or the pulling member has a handle part, the handle part has a switching part, the switching part abuts against an elastomer, the elastomer gives the switching part a reciprocating elastic force at switching.

30. The pulling member according to claim 4, wherein the plate body has an abutting part, wherein the blocking part or the abutting part is a convex part, a concave part, a curved part, a cambered face part, a curved face part, a step part or a plane part, or the pulling member has a handle part, the handle part has a switching part, the switching part abuts against an elastomer, the elastomer gives the switching part a reciprocating elastic force at switching.

31. The pulling member according to claim 5, wherein the pulling member has a blocking part, or the plate body has an abutting part, wherein the blocking part or the abutting part is a convex part, a concave part, a curved part, a cambered face part, a curved face part, a step part or a plane part, or the pulling member has a handle part, the handle part has a switching part, the switching part abuts against an elastomer, the elastomer gives the switching part a reciprocating elastic force at switching.

32. The pulling member according to claim 6, wherein the pulling member has a blocking part, or the plate body has an abutting part, wherein the blocking part or the abutting part is a convex part, a concave part, a curved part, a cambered face part, a curved face part, a step part or a plane part, or the pulling member has a handle part, the handle part has a switching part, the switching part abuts against an elastomer, the elastomer gives the switching part a reciprocating elastic force at switching.

33. The pulling member according to claim 7, wherein the pulling member has a blocking part, or the plate body has an abutting part, wherein the blocking part or the abutting part is a convex part, a concave part, a curved part, a cambered face part, a curved face part, a step part or a plane part, or the pulling member has a handle part, the handle part has a switching part, the switching part abuts against an elastomer, the elastomer gives the switching part a reciprocating elastic force at switching.

34. The pulling member according to claim 6, wherein when the corresponding object is put into or taken out from a pulling space of the pulling member or the plate body, the corresponding object abuts against the abutting part to make the pulling member bend to one side.

35. The pulling member according to claim 7, wherein when the corresponding object is put into or taken out from a pulling space of the pulling member or the plate body, the corresponding object abuts against the abutting part to make the pulling member bend to one side.

36. The pulling member according to claim 2, wherein the pulling part has a flange part, the flange part has a flexible distance, elastic motion distance or pre-abutting distance abutting against the plate body for allowing the flange part to elastically enter or automatically elastically enter a quick-detach hole part of the plate body.

37. The pulling member according to claim 6, wherein the pulling part has a flange part, the flange part has a flexible distance, elastic motion distance or pre-abutting distance abutting against the plate body for allowing the flange part to elastically enter or automatically elastically enter a quick-detach hole part of the plate body.

38. The pulling member according to claim 7, wherein the pulling part has a flange part, the flange part has a flexible distance, elastic motion distance or pre-abutting distance abutting against the plate body for allowing the flange part to elastically enter or automatically elastically enter a quick-detach hole part of the plate body.

\* \* \* \* \*